US010522386B2

(12) United States Patent
Shinohara et al.

(10) Patent No.: US 10,522,386 B2
(45) Date of Patent: Dec. 31, 2019

(54) SUSCEPTOR AND METHOD FOR MANUFACTURING SAME

(71) Applicant: TOYO TANSO CO., LTD., Osaka, Osaka (JP)

(72) Inventors: Masato Shinohara, Kanonji (JP); Yoshihisa Abe, Kanonji (JP); Satoru Nogami, Kanonji (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 378 days.

(21) Appl. No.: 15/321,421

(22) PCT Filed: Jun. 1, 2015

(86) PCT No.: PCT/JP2015/065763
§ 371 (c)(1),
(2) Date: Dec. 22, 2016

(87) PCT Pub. No.: WO2015/198798
PCT Pub. Date: Dec. 30, 2015

(65) Prior Publication Data
US 2017/0162425 A1    Jun. 8, 2017

(30) Foreign Application Priority Data

Jun. 24, 2014  (JP) ................................. 2014-128957

(51) Int. Cl.
*B23Q 3/00*         (2006.01)
*H01L 21/687*       (2006.01)
(Continued)

(52) U.S. Cl.
CPC .......... *H01L 21/68757* (2013.01); *C23C 8/20* (2013.01); *C23C 16/04* (2013.01);
(Continued)

(58) Field of Classification Search
USPC ...... 269/289 R, 292, 310; 428/172, 336, 408
See application file for complete search history.

(56) References Cited

U.S. PATENT DOCUMENTS 9,824,911 B2 *  11/2017  Ohno ............... H01L 21/68757
2008/0035632 A1 *  2/2008  Fujita ................. C23C 16/4581
219/634
(Continued)

FOREIGN PATENT DOCUMENTS

CN        101001978 A     7/2007
CN        101374973 A     2/2009
(Continued)

OTHER PUBLICATIONS

Office Action dated Jul. 18, 2017, issued in counterpart Japanese Application No. 2014-128957, with English machine translation. (7 pages).
(Continued)

*Primary Examiner* — Joseph J Hail
*Assistant Examiner* — Shantese L McDonald
(74) *Attorney, Agent, or Firm* — Westerman, Hattori, Daniels & Adrian, LLP

(57) ABSTRACT

Provided are a susceptor that, in forming a thin film on a wafer, can reduce impurities or the like adhering to the wafer and a method for manufacturing the same. A susceptor includes a base material (10) with a recess (11), a tantalum carbide layer (22) formed directly on a bottom surface (11*a*) and a side surface (11*b*) of the recess (11), and a silicon carbide layer (20) formed on a surface of the base material (10) except for the recess (11).

11 Claims, 4 Drawing Sheets

(51) Int. Cl.
- *C23C 16/04* (2006.01)
- *C23C 16/458* (2006.01)
- *C23C 16/56* (2006.01)
- *H01L 21/205* (2006.01)
- *C23C 8/20* (2006.01)
- *C23C 16/06* (2006.01)
- *C23C 16/32* (2006.01)
- *C30B 25/12* (2006.01)

(52) U.S. Cl.
CPC .......... *C23C 16/042* (2013.01); *C23C 16/045* (2013.01); *C23C 16/06* (2013.01); *C23C 16/325* (2013.01); *C23C 16/458* (2013.01); *C23C 16/4581* (2013.01); *C23C 16/56* (2013.01); *C30B 25/12* (2013.01); *H01L 21/205* (2013.01)

(56) References Cited

U.S. PATENT DOCUMENTS

| | | |
|---|---|---|
| 2009/0266300 A1 | 10/2009 | Iizuka |
| 2012/0301723 A1 | 11/2012 | Kondo |
| 2013/0327274 A1 | 12/2013 | Ohno et al. |
| 2015/0321966 A1* | 11/2015 | Shinohara .............. C04B 41/009 428/172 |
| 2017/0175262 A1* | 6/2017 | Kawada ............ H01L 21/02576 |

FOREIGN PATENT DOCUMENTS

| | | |
|---|---|---|
| CN | 103484837 A | 1/2014 |
| DE | 10 2013 204566 A1 | 12/2013 |
| EP | 1 790 757 A1 | 5/2007 |
| JP | 11-269646 A | 10/1999 |
| JP | 2004-84057 A | 3/2004 |
| JP | 2006-041358 A | 2/2006 |
| JP | 2006-60195 A | 3/2006 |
| JP | 4252944 B2 | 4/2009 |
| JP | 2009-252969 A | 10/2009 |
| JP | 2011-153377 A | 8/2011 |
| JP | 2012-222284 A | 11/2012 |
| JP | 2013-254853 A | 12/2013 |
| WO | 2014/123036 A1 | 8/2014 |

OTHER PUBLICATIONS

Office Action dated Jul. 30, 2018, issued in counterpart Chinese Application No. 201580032799.5, with English translation. (13 pages).

International Search Report dated Aug. 18, 2015, issued in counterpart of International Application No. PCT/JP2015/065763 (2 pages).

Extended Search Report dated Dec. 19, 2017, issued in counterpart European Application No. 15812047.7 (6 pages).

Notification of Transmittal of Translation of the International Preliminary Report on Patentability (Form PCT/IB/338) issued in counterpart International Application No. PCT/JP2015/065763 dated Jan. 5, 2017, with Forms PCT/IB/373 and PCT/ISA/237. (8 pages).

* cited by examiner

[FIG. 1.]
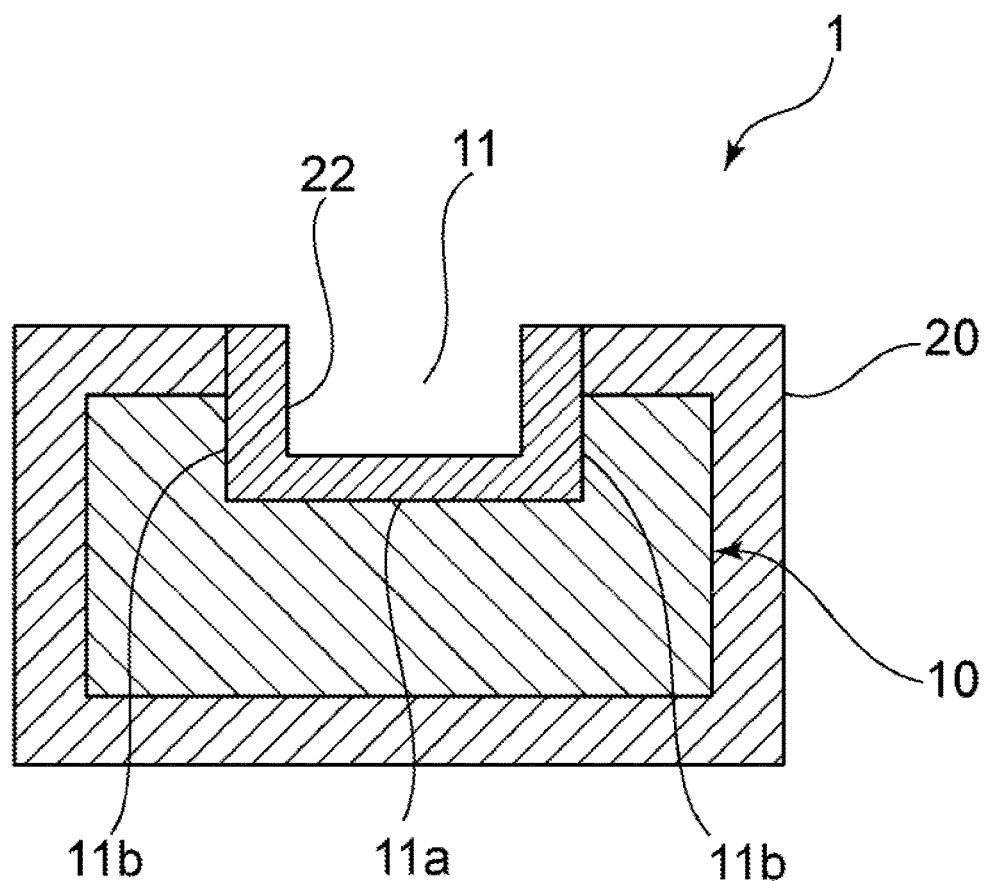

[FIG. 2.]
(a)
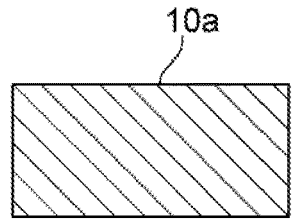
(b)
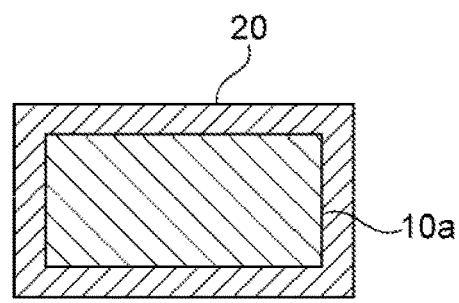
(c)
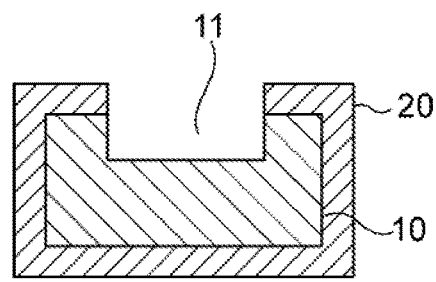
(d)
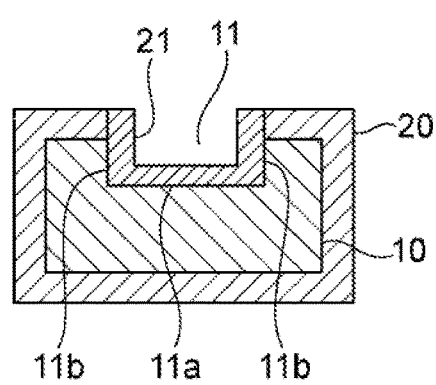

[FIG. 3.]
(a)
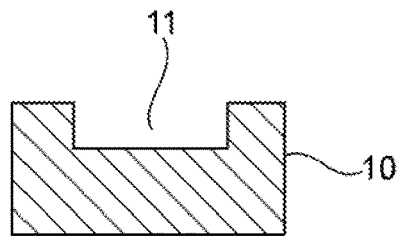
(b)
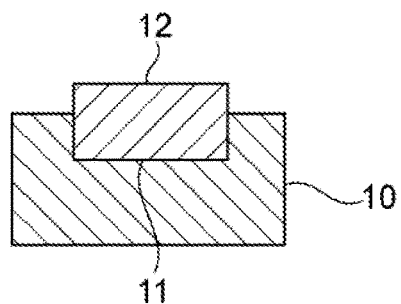
(c)
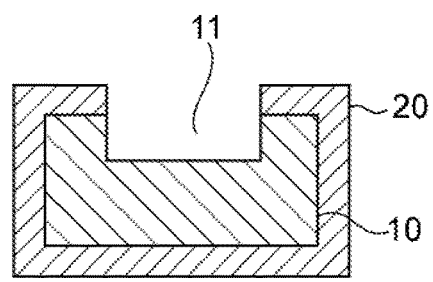
(d)
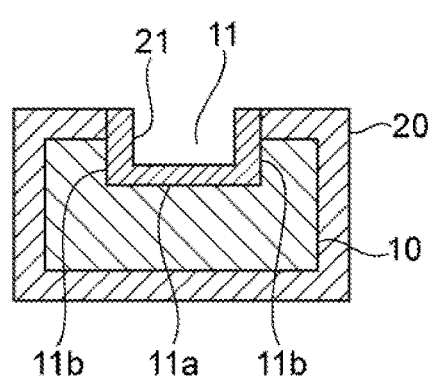

[FIG. 4.]
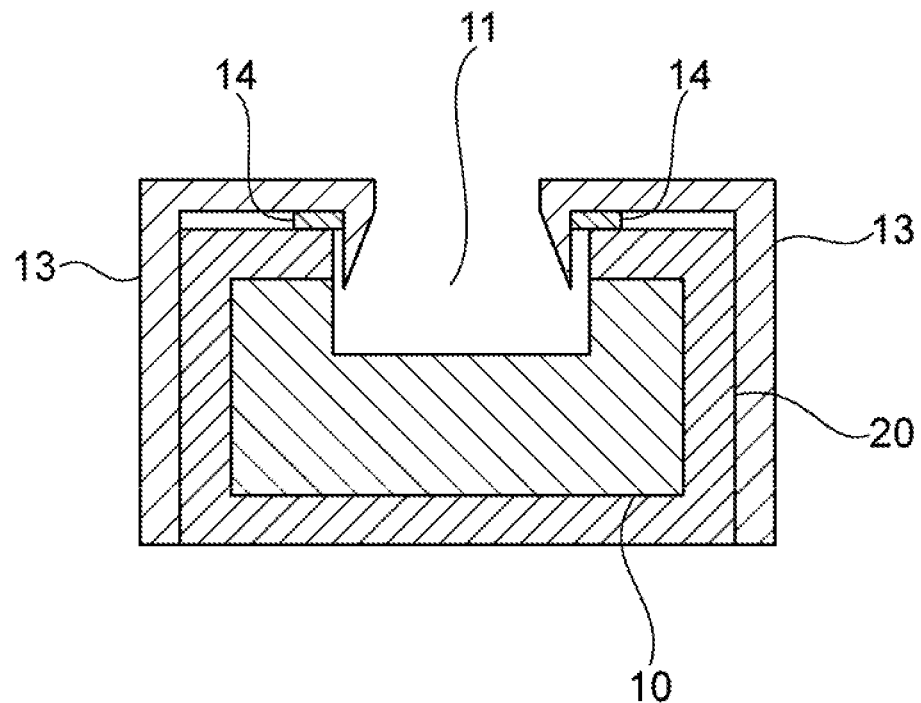
[FIG. 5.]
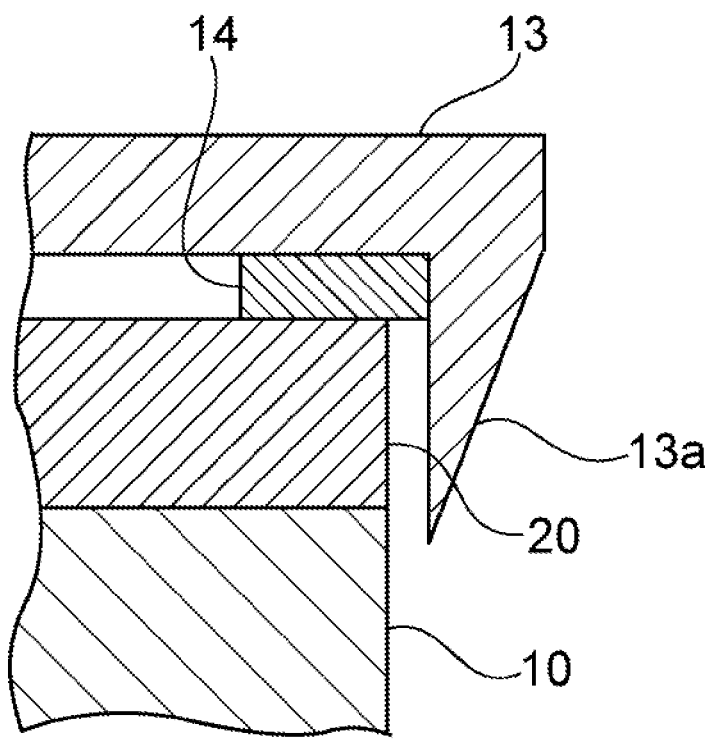

SUSCEPTOR AND METHOD FOR MANUFACTURING SAME

TECHNICAL FIELD

The present invention relates to susceptors and methods for manufacturing the same.

BACKGROUND ART

Conventionally, it is known to use, in a semiconductor manufacturing process or the like, a susceptor whose surface layer is made of silicon carbide. However, in cases such as where silicon carbide or the like is epitaxially grown on a wafer, the wafer and the susceptor are exposed to high temperatures, for example, over 1500° C. Thus, there arises a problem of adhesion of silicon carbide forming the surface layer of the susceptor to the wafer.

To solve the above problem, Patent Literature 1 proposes a susceptor in which a portion for placing a wafer thereon is formed of a detachable member made of tantalum carbide and a peripheral portion around the portion for placing a wafer thereon is formed of a detachable silicon carbide-coated graphite member.

CITATION LIST

Patent Literature

Patent Literature 1: JP-A-2006-60195

SUMMARY OF INVENTION

Technical Problem

However, since the susceptor disclosed in Patent Literature 1 is formed of a plurality of members, if has the problem of its manufacturing process being complicated and the problem of being difficult to handle.

To solve these problems, it may be conceivable to coat the entire surface of the susceptor with tantalum carbide. However, the coating of the entire surface of the susceptor with tantalum carbide causes the problem that when a silicon carbide film or the like is deposited on a wafer, the silicon carbide film deposited on the tantalum carbide layer peels off, so that resultant silicon carbide particles adhere to the wafer. Furthermore, because there is a difference in coefficient of thermal expansion (CTE) between the tantalum carbide layer and graphite forming the base material, this presents the problem of the entire susceptor warping.

An object of the present invention is to provide a susceptor that, in forming a thin film on a wafer, can reduce impurities or the like adhering to the wafer and a method for manufacturing the same.

Solution to Problem

A susceptor according to the present invention includes a base material with a recess, a tantalum carbide layer formed directly on a bottom surface of the recess, and a silicon carbide layer formed on a surface of the base material except for the recess.

In the present invention, the tantalum carbide layer may also be formed directly on a side surface of the recess.

The base material is preferably made of a carbon material and more preferably made of graphite.

A method for manufacturing a susceptor according to a first aspect of the present invention includes the steps of: preparing an original base material in which a recess is yet to be formed; forming a silicon carbide layer on a surface of the original base material; forming the recess in the original base material and removing a region of the silicon carbide layer corresponding to the recess; and forming a tantalum carbide layer on a bottom surface of the recess.

A method for manufacturing a susceptor according to a second aspect of the present invention includes the steps of: preparing a base material with a recess formed therein; forming a silicon carbide; layer on a surface of the base material except for the recess; and forming a tantalum carbide layer on a bottom surface of the recess.

In the second aspect of the present invention, the step of forming a silicon carbide layer may include the steps of: placing a masking member in the recess; forming a silicon carbide layer on a surface of the base material on which the masking member is placed; and removing the masking member from the recess after forming the silicon carbide layer.

In the manufacturing methods according to the first and second aspects of the present invention, the step of forming a tantalum carbide layer may include the steps of: forming a metal tantalum layer on a bottom surface of the recess; and subjecting the metal tantalum layer to a carburization treatment to form a tantalum carbide layer.

In the manufacturing methods according to the first and second aspects of the present invention, the step of forming a tantalum carbide layer may include the steps of: providing a masking jig to cover the surface of the base material except for the recess; and forming a tantalum carbide layer after providing the masking jig.

In the manufacturing methods according to the first and second aspects of the present invention, the tantalum carbide layer may be concurrently formed on the bottom surface and a side surface of the recess.

In the manufacturing methods according to the first and second aspects of the present invention, in order that in forming a tantalum carbide layer, the tantalum carbide layer is prevented from being formed to penetrate between the masking jig and the base material, an expandable graphite sheet is preferably placed between the masking jig and the base material.

Advantageous Effects of Invention

According to the present invention, it can be reduced that in forming a thin film on a wafer, impurities or the like adhere to the wafer.

BRIEF DESCRIPTION OF DRAWINGS

FIG. 1 is a schematic cross-sectional view showing a susceptor according to one embodiment of the present invention.

FIG. 2 is a schematic cross-sectional view showing a manufacturing process according to an embodiment of a first aspect of the present invention.

FIG. 3 is a schematic cross-sectional view showing a manufacturing process according to an embodiment of a second aspect of the present invention.

FIG. 4 is a schematic cross-sectional view showing a masking jig for use in the embodiment of the present invention.

FIG. 5 is a schematic cross-sectional view showing on an enlarged scale a distal end portion of the masking jig.

DESCRIPTION OF EMBODIMENTS

A description will be given below of preferred embodiments. However, the following embodiments are merely illustrative and the present invention is not limited by the following embodiments. Furthermore, throughout the drawings, members having substantially the same functions may be referred to by the same references.

FIG. 1 is a schematic cross-sectional view shoving a susceptor according to one embodiment of the present invention. A susceptor 1 includes a base material 10 with a recess 11, a tantalum carbide layer 22, and a silicon carbide layer 20. The susceptor 1 is used, for example, in manufacturing semiconductors by placing a wafer on the tantalum carbide layer 22 which is a placement surface for the wafer. The tantalum carbide layer 22 is formed directly on a bottom surface 11a and a side surface 11b of the recess 11. Although in this embodiment the tantalum carbide layer 22 is formed on both the bottom surface 11a and the side surface 11b of the recess 11, it is sufficient in the present invention that the tantalum carbide layer 22 is formed at least on the bottom surface 11a. The silicon carbide layer 20 is formed on the surface of the base material 10 except for the recess 11. In this embodiment, the silicon carbide layer 20 is formed directly on the surface of the base material 10.

The base material 10 is preferably made of a carbon material and more preferably made of graphite. Furthermore, the base material 10 is preferably made of a material having a coefficient of thermal expansion (CTE) comparable with that of the silicon carbide layer 20 formed thereon. From these viewpoints, the base material 10 is preferably made of a material having a coefficient of thermal expansion (CTE) of 4 to 6.5/° C. (350 to 450° C.). Also from such viewpoints, the base material 10 is preferably made of a carbon material, such as graphite.

The silicon carbide layer 20 can be formed, for example, by a CVD process. The thickness of the silicon carbide layer 20 is preferably within a range from 50 μm to 300 μm and more preferably within a range from 80 μm to 160 μm.

The tantalum carbide layer 22 can be formed, for example, by forming a metal tantalum layer by a CVD process and then subjecting the metal tantalum layer to a carburization treatment. Such a formation of a tantalum carbide layer is described in, such as, for example, Published Japanese Patent Application No. 2011-153070. The thickness of the tantalum carbide layer 22 is, but not particularly limited to, preferably, for example, within a range from 10 μm to 30 μm.

In this embodiment, the tantalum carbide layer 22 is formed on the inside of the recess 11 on which a wafer is to be placed, and the wafer can be placed on the tantalum carbide layer 22. Therefore, it is avoided that silicon carbide adheres to the underside of the wafer. Furthermore, the silicon carbide layer 20 is formed on the surface of the base material 10 except for the recess 11. For this reason, even if silicon carbide is deposited on the silicon carbide layer 20 while silicon carbide is epitaxially grown on the wafer, the deposited silicon carbide does not peel off. Therefore, it can be prevented that the deposited silicon carbide peels into particles and the particles adhere to the surface of the wafer. Hence, in this embodiment, it can be reduced that in forming a thin film on a wafer, impurities or the like adhere to the wafer.

Furthermore, in this embodiment, the tantalum carbide layer 22 is formed directly on the bottom surface 11a and the side surface 11b of the recess 11. Therefore, the tantalum carbide layer 22 can be formed with good adhesiveness on the base material 10. It may foe conceivable that after the silicon carbide layer 20 is formed on the entire surface of the base material 10, inclusive of the inside of the recess 11, the tantalum carbide layer 22 is formed on the inside of the recess 11. In this case, the tantalum carbide layer 22 on the inside of the recess 11 is formed on the silicon carbide layer 20. In the case where, as in this embodiment, the tantalum carbide layer 22 is formed directly on the base material 10, the tantalum carbide layer 22 can be formed with good adhesiveness as compared with the case where the tantalum carbide layer 22 is formed on the silicon carbide layer 20. In addition, if the tantalum carbide layer 22 is formed on the silicon carbide layer 20, thickness variations or irregularities of the silicon carbide layer 20 make it difficult to provide high dimensional accuracy. In the case where the tantalum carbide layer 22 is formed directly on the base material 10, a coating thickness of the tantalum carbide layer 22 only is added onto the base material 10, which can increase the dimensional accuracy of the recess 11. In the case of placing a wafer within the recess 11, the recess 11 is often required to have high dimensional accuracy, which is a great advantage in use as a susceptor.

Moreover, in this embodiment, since the silicon carbide layer 20 having a coefficient of thermal expansion close to that of the base material 10 is formed on the stir face of the base material 10 except for the recess 11, this can prevent the susceptor 1 from warping.

The susceptor 1 according to the embodiment shown in FIG. 1 can be manufactured, for example, by manufacturing methods according to first and second aspects as described below.

FIG. 2 is a schematic cross-sectional view showing a manufacturing process according to an embodiment of a first aspect of the present invention.

As shown in FIG. 2(a), an original base material 10a in which a recess 11 is yet to be formed is prepared. Next, as shown in FIG. 2(b), a silicon carbide layer 20 is formed on the surface of the original base material 10a. In this embodiment, the silicon carbide layer 20 is formed on the entire surface of the original base material 10a. The silicon carbide layer 20 is formed by a CVD process.

As shown in FIG. 2(c), next, a recess 11 is formed in the original base material 10a having the silicon carbide layer 20 formed thereon. The recess 11 is formed, for example, by machining. While the recess 11 is formed, a region of the silicon carbide layer 20 corresponding to the recess 11 is removed.

After the recess 11 is formed, the silicon carbide layer 20 and a portion of the base material 10 exposed in the recess 11 are preferably subjected to a purification treatment. For example, the purification treatment can be performed by a heat treatment using chlorine gas and hydrogen gas, chlorine trifluoride gas or the like. It is preferred to reduce the ash content of the portion of the base material 10 exposed in the recess 11 to 20 ppm or less by the purification treatment.

As shown in FIG. 2(d), next, a metal tantalum layer 21 is formed on the bottom surface 11a and the side surface 11b of the recess 11. The metal tantalum layer 21 is formed, for example, by a CVD process.

FIG. 4 is a schematic cross-sectional view showing a masking jig for use in the embodiment. FIG. 5 is a schematic cross-sectional view showing on an enlarged scale a distal end portion of the masking jig. In forming the metal tantalum layer 21, a masking jig 13 shown in FIG. 4 is placed to cover a region where the silicon carbide layer 20 is formed. As shown in FIGS. 4 and 5, an expandable graphite sheet 14 is sandwiched, in a peripheral region of the recess 11, between the masking jig 13 and the base material 10. By sandwiching the expandable graphite sheet 14 between the masking jig 13 and the base material 10, the metal tantalum layer 21 can be prevented from being formed to penetrate between the masking jig 13 and the base material 10. The thickness of the expandable graphite sheet 14 is preferably about 0.1 to about 1.0 mm.

As shown in FIGS. 4 and 5, a distal end portion 13a of the masking jig 13 is formed to extend toward the bottom surface of the recess 11. This prevents displacement of the expandable graphite sheet 14.

However, excessive suppression of penetration of a metal tantalum layer 22 in forming the metal tantalum layer 21 may cause a lack of the thickness of the tantalum carbide layer in the recess 11. In the case where a tantalum carbide layer having a sufficient thickness is formed, the tantalum carbide layer formed to slightly penetrate and protrude onto a susceptor top surface of the silicon carbide layer 20 does not cause any significant inconvenience. The protrusion of the tantalum carbide layer onto the susceptor top surface of the silicon carbide layer 20 is preferably controlled to 5 mm or less and more preferably 3 mm or less.

In the above manner, as shown in FIG. 2(d), the metal tantalum layer 21 is formed directly on the bottom surface 11a and the side surface 11b of the recess 11.

Next, the metal tantalum layer 21 formed on the inside of the recess 11 is subjected to a carburization treatment to form a tantalum carbide layer 22. The carburization treatment can be performed, for example, by a method described in Published Japanese Patent Application No. 2011-153070.

In the manner as thus far described, the susceptor 1 according to the embodiment shown in FIG. 1 can be manufactured.

FIG. 3 is a schematic cross-sectional view showing a manufacturing process according to an embodiment of a second aspect of the present invention.

First, as shown in FIG. 3(a), a base material 10 with a recess 11 formed therein is prepared. The recess 11 can be formed, for example, by machining or other processing.

Next, as shown in FIG. 3(b), a masking member 12 is placed in the recess 11 of the base material 10. The masking member 12 used is preferably one having a coefficient of thermal expansion close to that of the base material 10 so that when heated, no gap is formed between itself and the recess 11. In this embodiment, the masking member 12 is formed using the same type of graphite as graphite forming the base material 10.

Next, a silicon carbide layer 20 is formed on the surface of the base material 10. The silicon carbide layer 20 is formed by a CVD process. Although the silicon carbide layer 20 is also formed on the masking member 12, a state shown in FIG. 3(c) is reached by removing the masking member 12 after the silicon carbide layer 20 has been formed. In this state, like the first aspect, the silicon carbide layer 20 is preferably subjected to a purification treatment.

Next, like the first aspect, as shown in FIG. 3(d), a metal tantalum layer 21 is formed on the bottom surface 11a and the side surface 11b of the recess 11.

Next, like the first aspect, the metal tantalum layer 21 formed on the inside of the recess 11 is subjected to a carburization treatment to form a tantalum carbide layer 22.

In the above manner, the susceptor 1 according to the embodiment shown in FIG. 1 can be manufactured.

Furthermore, in the case where a material having a linear expansion coefficient approximating that of the silicon carbide layer 20 is selected as the base material 10, if the tantalum carbide layer 22 is formed at, for example, 1800° C. and then cooled to room temperature, a difference in linear expansion coefficient between silicon carbide and tantalum carbide may cause production of fine cracks in the tantalus carbide layer 22. Because the base material 10 is exposed in the cracks, its contact with a reaction gas may cause, for example, corrosion of graphite of the base material 10. However, when the susceptor 1 is used as a susceptor for SiC epitaxial growth, the reaction temperature rises to about 1500° C. to about 1700° C. Thus, the extended cracks are filled during the reaction by the tantalum carbide layer 22 having expanded, so that the corrosion of the base material 10 can be prevented.

By applying the usage as described above, regardless of the linear expansion coefficient relation between the base material 10 and the tantalum carbide layer 22, an appropriate material can be selected for the base material 10 to form a susceptor.

In this usage, the difference between the formation temperature and the service temperature of the tantalum carbide layer is preferably not higher than 300° C. and more preferably not higher than 200° C.

Although the description of the method for manufacturing a susceptor according to the present invention has been given by taking as examples the method according to the first aspect shown in FIG. 2 and the method according to the second aspect shown in FIG. 3, the present invention is not limited to these methods.

Furthermore, although the description of the susceptor according to the present invention has been given by taking as an example the susceptor according to the embodiment shown in FIG. 1, the present invention is not limited to this.

REFERENCE SIGNS LIST

1 . . . susceptor
10 . . . base material
10a . . . original base material
11 . . . recess
11a . . . bottom surface
11b . . . side surface
12 . . . masking member
13 . . . masking jig
13a . . . distal end portion
14 . . . expandable graphite sheet
20 . . . silicon carbide layer
21 . . . metal tantalum layer
22 . . . tantalum carbide layer

The invention claimed is:

1. A susceptor comprising:
a base material with a recess;
a tantalum carbide layer formed directly on a bottom surface of the recess; and
a silicon carbide layer formed directly on a surface of the base material except for the recess.

2. The susceptor according to claim 1, wherein the tantalum carbide layer is also formed directly on a side surface of the recess.

3. The susceptor according to claim 1, wherein the base material is made of a carbon material.

4. The susceptor according to claim 3, wherein the base material is made of graphite.

5. A method for manufacturing the susceptor according to claim 1, the method comprising the steps of:

preparing an original base material in which the recess is yet to be formed;

forming the silicon carbide layer on a surface of the original base material;

forming the recess in the original base material and removing a region of the silicon carbide layer corresponding to the recess; and forming the tantalum carbide layer on a bottom surface of the recess.

6. The method for manufacturing the susceptor according to claim 5, wherein the step of forming the tantalum carbide layer comprises the steps of:

providing a masking jig to cover the surface of the base material except for the recess; and forming the tantalum carbide layer after providing the masking jig.

7. The method for manufacturing the susceptor according to claim 6, wherein in the step of forming the tantalum carbide layer, an expandable graphite sheet is placed between the masking jig and the base material.

8. The method for manufacturing the susceptor according to claim 5, wherein in the step of forming the tantalum carbide layer, the tantalum carbide layer is concurrently formed on the bottom surface and a side surface of the recess.

9. A method for manufacturing the susceptor according to claim 1, the method comprising the steps of:

preparing the base material with the recess formed therein;

forming the silicon carbide layer on a surface of the base material except for the recess; and forming the tantalum carbide layer on a bottom surface of the recess.

10. The method for manufacturing the susceptor according to claim 9, wherein the step of forming the silicon carbide layer comprises the steps of:

placing a masking member in the recess;

forming the silicon carbide layer on a surface of the base material on which the masking member is placed; and removing the masking member from the recess after forming the silicon carbide layer.

11. The method for manufacturing the susceptor according to claim 5, wherein the step of forming the tantalum carbide layer comprises the steps of:

forming a metal tantalum layer on a bottom surface of the recess; and subjecting the metal tantalum layer to a carburization treatment to form a tantalum carbide layer.

* * * * *